(12) United States Patent
Kinsella et al.

(10) Patent No.: US 7,317,264 B2
(45) Date of Patent: Jan. 8, 2008

(54) METHOD AND APPARATUS TO INDEPENDENTLY CONTROL CONTACTORS IN A MULTIPLE CONTACTOR CONFIGURATION

(75) Inventors: James Kinsella, Madison, WI (US); Xin Zhou, Brookfield, WI (US); Christopher J. Wieloch, Brookfield, WI (US); Michael T. Little, Milwaukee, WI (US)

(73) Assignee: Eaton Corporation, Cleveland, OH (US)

( * ) Notice: Subject to any disclaimer, the term of this patent is extended or adjusted under 35 U.S.C. 154(b) by 588 days.

(21) Appl. No.: 10/707,187

(22) Filed: Nov. 25, 2003

(65) Prior Publication Data

US 2005/0122085 A1    Jun. 9, 2005

(51) Int. Cl.
*H01H 3/00* (2006.01)
(52) U.S. Cl. .................................... 307/139
(58) Field of Classification Search ............... 307/147, 307/139, 140
See application file for complete search history.

(56) References Cited

U.S. PATENT DOCUMENTS

| | | | |
|---|---|---|---|
| 3,934,110 A | 1/1976 | Denis | 219/131 F |
| 3,982,137 A | 9/1976 | Penrod | 307/136 |
| 4,019,017 A | 4/1977 | Sitek et al. | 219/135 |
| 4,056,836 A | 11/1977 | Knauer | 361/4 |
| 4,128,749 A | 12/1978 | Spaderna | 200/254 |
| 4,152,634 A * | 5/1979 | Penrod | 318/739 |
| 4,354,215 A | 10/1982 | van der Scheer | 361/63 |
| 4,360,847 A * | 11/1982 | Bloomer et al. | 361/3 |
| 4,398,097 A | 8/1983 | Schell et al. | 307/64 |
| 4,445,018 A | 4/1984 | Holmgren | 200/148 A |
| 4,491,708 A | 1/1985 | O'Leary et al. | 200/149 R |
| 4,525,762 A | 6/1985 | Norris | 361/13 |
| 4,642,481 A | 2/1987 | Bielinski et al. | 307/252 |
| 4,864,157 A | 9/1989 | Dickey | 307/135 |
| 4,931,715 A * | 6/1990 | Lee et al. | 318/709 |
| 4,959,746 A | 9/1990 | Hongel | 361/13 |
| 5,493,091 A | 2/1996 | Devautour et al. | 218/30 |
| 5,514,844 A | 5/1996 | Hamano et al. | 218/57 |
| 5,644,463 A | 7/1997 | El-Sharkawi et al. | |
| 5,959,517 A | 9/1999 | Wieloch et al. | 335/16 |
| 6,087,800 A | 7/2000 | Becker et al. | 318/778 |
| 6,377,143 B1 | 4/2002 | Zhou et al. | 335/132 |
| 6,392,390 B1 | 5/2002 | Ito et al. | |
| 6,476,697 B2 * | 11/2002 | Swartzentruber et al. | 335/132 |
| 6,538,347 B1 | 3/2003 | Baranowski et al. | |
| 6,967,549 B2 * | 11/2005 | Zhou et al. | 335/106 |

FOREIGN PATENT DOCUMENTS

| | | |
|---|---|---|
| DE | 41 05 697 A1 | 8/1992 |
| EP | 1 453 073 A1 | 9/2004 |
| EP | 1 492 142 A2 | 12/2004 |
| GB | 2 294 166 A | 4/1996 |
| WO | WO 03/028056 A1 | 4/2003 |

\* cited by examiner

*Primary Examiner*—Robert L. Deberadinis
(74) *Attorney, Agent, or Firm*—Ziolkowski Patent Solutions Group, SC

(57) ABSTRACT

A method and apparatus to independently control the closing or making of contactors in a modular contactor assembly is disclosed. The apparatus includes a contactor assembly having multiple contactors such that each contactor is separately controlled such that one contactor may be closed without the other contactors of the assembly being closed. The contactors are arranged such that a pair of contactors is caused to close following a zero-voltage crossing of a power signal. A third contactor is caused to close after the pair of contactors has closed.

21 Claims, 11 Drawing Sheets

METHOD AND APPARATUS TO INDEPENDENTLY CONTROL CONTACTORS IN A MULTIPLE CONTACTOR CONFIGURATION

BACKGROUND OF INVENTION

The present invention relates generally to an electrical switching device, and more particularly, to a method and apparatus of independently closing contactors of a modular contactor assembly.

Typically, contactors are used in starter applications to switch on/off a load as well as to protect a load, such as a motor, or other electrical devices from current overloading. As such, a typical contactor will have three contact assemblies; a contact assembly for each phase or pole of a three-phase electrical device. Each contact assembly typically includes a pair of stationary contacts and a moveable contact. One stationary contact will be a line side contact and the other stationary contact will be a load side contact. The moveable contact is controlled by an actuating assembly comprising an armature and magnet assembly which is energized by a coil to move the moveable contact to form a bridge between the stationary contacts. When the moveable contact is engaged with both stationary contacts, current is allowed to travel from the power source or line to the load or electrical device. When the moveable contact is separated from the stationary contacts, an open circuit is created and the line and load are electrically isolated from one another.

Generally, a single coil is used to operate a common carrier for all three contact assemblies. As a result, the contactor is constructed such that whenever a fault condition or switch open command is received in any one pole or phase of the three-phase input, all the contact assemblies of the contactor are opened in unison. Similarly, when a closed circuit or conducting condition is desired, all the contacts assemblies are controlled to close in unison. Simply, the contact assemblies are controlled as a group as opposed to being independently controlled.

This contactor construction has some drawbacks, particularly in high power applications. Since there is a contact assembly for each phase of the three-phase input, the contact elements of the contact assembly must be able to withstand high current conditions or risk being weld together under fault (high current) or abnormal switching conditions. The contacts must therefore be fabricated from composite materials that resist welding. These composite materials can be expensive and contribute to increased manufacturing costs of the contactor. Other contactors have been designed with complex biasing mechanisms to regulate "blow open" of the contacts under variable fault conditions, but the biasing mechanisms also add to the complexity and cost of the contactor. Alternately, to improve contact element resistance to welding without implementation of more costly composites can require larger contact elements. Larger contacts provide greater heat sinking and current carrying capacity. Increasing the size of the contact elements, however, requires larger actuating mechanisms, coils, biasing springs, and the like, which all lead to increased product size and increased manufacturing costs.

Additionally, a contactor wherein all the contact assemblies open in unison can result in contact erosion as a result of arcs forming between the contacts during breaking. When all the contact assemblies or sets of contacts are controlled in unison, a detected abnormal condition, such as a fault condition, in any phase of the three-phase input causes all the contact assemblies to break open because the contact assemblies share a bridge or crossbar. Therefore, breaking open of the contacts of one contact assembly causes the contacts of the other contact assemblies to also open. As a result, the contacts may open at non-ideal current conditions. For example, the contactor may be controlled such that a fault condition is detected in the first phase of the three phase input and the contacts of the corresponding assembly are controlled to open when the current in the first phase is at a zero crossing. Since the second and third phases of a three phase input lag the first phase by 120 and 240 degrees, respectively, breaking open of the contacts for the contact assemblies for the second and third phases at the opening of the contacts of the contact assembly of the first phase causes the second and third contact assemblies to open when the current through the contacts is not zero. This non-zero opening can cause arcing between the contact elements of the second and third contact assemblies causing contact erosion that can lead to premature failure of the contactor. This holds true for both abnormal switching as stated above as well as normal duty.

This unison-controlled construction also has disadvantages associated with the closing of contacts to cause high transient current conduction between a power source and a load. The closing in unison of all the contacts can cause mechanical torque oscillations that are often negative. As a result, the windings of a motor as well as the mechanical components of the system are subjected to damaging stresses. Additionally, the motor circuit protection disconnect (breaker or fusing) may have to be oversized to avoid unwanted, or "nuisance", tripping by this high transient current.

It would therefore be desirable to design a modular electromagnetic contactor assembly having multiple contactors that can be independently controlled such that negative torque oscillations may be minimized. It would be further desirable to design such a modular contactor assembly wherein each contactor is constructed in such a manner as to withstand higher currents under fault conditions without increased contactor complexity and size.

BRIEF DESCRIPTION OF INVENTION

The present invention provides a method and apparatus of independently controlling contactors of a modular contactor assembly overcoming the aforementioned drawbacks and provides a control scheme that is applicable therewith. The contactor assembly includes a contactor for each phase or pole of an electrical device. The contactor assembly is applicable as both a switching device and an isolation or load protection device. As such, each contactor is constructed so that each includes multiple contact assemblies. Moreover, the contactors within a single contactor assembly or housing can be independently controlled so that the contacts of one contactor can be closed without closing the contacts of the other contactors in the contactor assembly.

Accordingly, in one aspect, the present invention includes a method of controlling contactor switching that includes the step of monitoring voltage in an electrical system having a power source and a load. At least a first contactor of a multi-contactor assembly is closed at a first phase angle following a voltage zero-crossing in the system. Thereafter, another contactor is closed at a prescribed moment following the closing of the first contactor. In one particular aspect, all other contactors are closed at the prescribed moment following the closing of the first contactor.

In accordance with another aspect of the present invention, a modular contactor system includes a plurality of stationary contacts and a plurality of movable contacts housed within a single contactor assembly. A plurality of actuating assemblies are provided and each of which is in operable association with at least one movable contact. A controller is in operable association with the plurality of actuating assemblies and is configured to cause less than all the plurality of movable contacts to engage less than all the stationary contacts when a closed circuit path command signal is received.

According to another aspect of the invention, a controller is provided to independently regulate closing of contactors of a modular contactor assembly. The controller is programmed to transmit a first contactor close signal to at least one actuating assembly for a pair of contactors at a first moment after a preceding voltage zero-crossing in an electrical system so as to close the pair of contactors. The controller is further programmed to transmit a second contactor close signal to an actuating assembly for a third contactor at a second moment after the first moment so as to close the third contactor such that negative torque oscillations in the electrical system are minimized.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

The present invention will be described with respect to an electromagnetic contactor assembly for use in starter applications such as, the switching on/off of a load as well as to protect a load, such as a motor, from current overload. The electromagnetic contactor assembly and controls of the present invention are equivalently applicable to heating load contactor assemblies, on-demand modular contactor assemblies, modular large frame contactor assemblies, and the like. The present invention is also applicable with other types of contactor assemblies where it is desirable to reduce contact erosion resulting from arcs during breaking and bounce arcs during making of the contacts. Additionally, the present invention will be described with respect to implementation with a three-phase electrical device; however, the present invention is equivalently applicable with other electrical devices.

Figure 1:
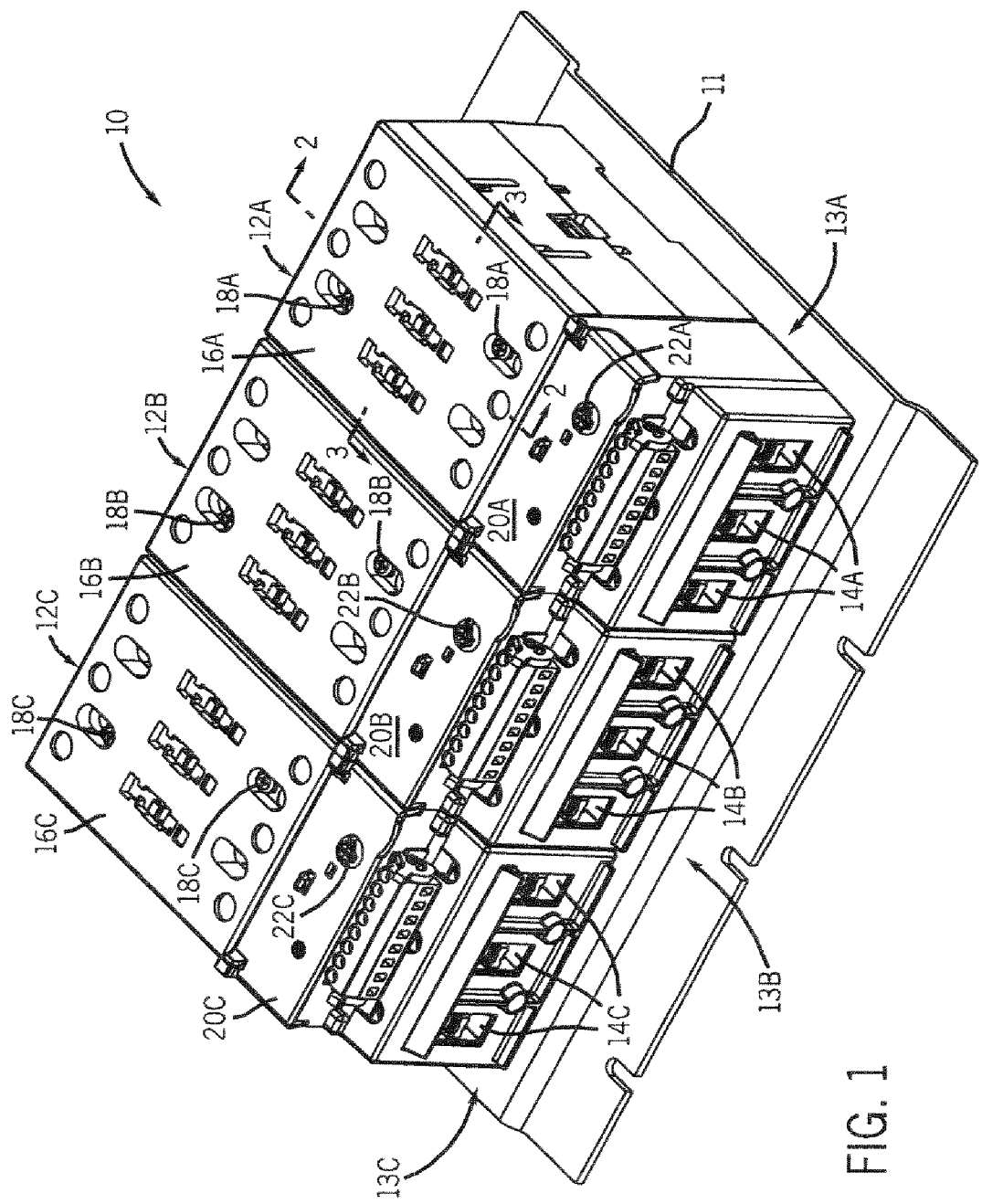
FIG. 1 is a perspective view of a modular contactor assembly in accordance with the present invention.

Referring now to FIG. 1, a modular contactor assembly 10 is shown in perspective view. The modular contactor assembly 10 includes electromagnetic contactors 12A-C for a three phase electrical system. Each contactor 12A-C is designed to switch current to a motor or other electrical device. In the shown configuration, contactors 12A-C are mounted to plate 11 configured to support each of the contactors as well as an optional cover (not shown). In the illustrated embodiment, each of the contactors 12A-C of contactor assembly 10 is connected to an overload relay 13A-C for use in a starter that operates in industrial control applications, such as motor control. Assembly 10 could equivalently be implemented without relays 13A-C for other applications. Apertures 14A-C located in each relay 13A-C, respectively, facilitate electrical connection of lead wires to the contactor assembly. Since each contactor/overload relay includes three apertures; a common bus plate (not shown) jumping all three apertures could be inserted for the end user to attach single point wiring. The bus plate may include lugs or ring terminals for the end user to connect wires to the assembly. As will be described in greater detail below, this three-way connection for each phase is beneficial under fault conditions as the current for each phase A-C can be distributed evenly within each contactor to assist with minimizing contact arcing and contact erosion, especially on make. Each contactor 12A-C includes a top cover 16A-C that is secured to the contactor frame via screws 18A-C. Each relay 13A-C also includes a cover 20A-C that is snapped to the relay frame and is hinged to allow access to an FLA adjustment potentiometer (not shown). Each relay 13A-C includes a reset button 22A-C.

Figure 2:
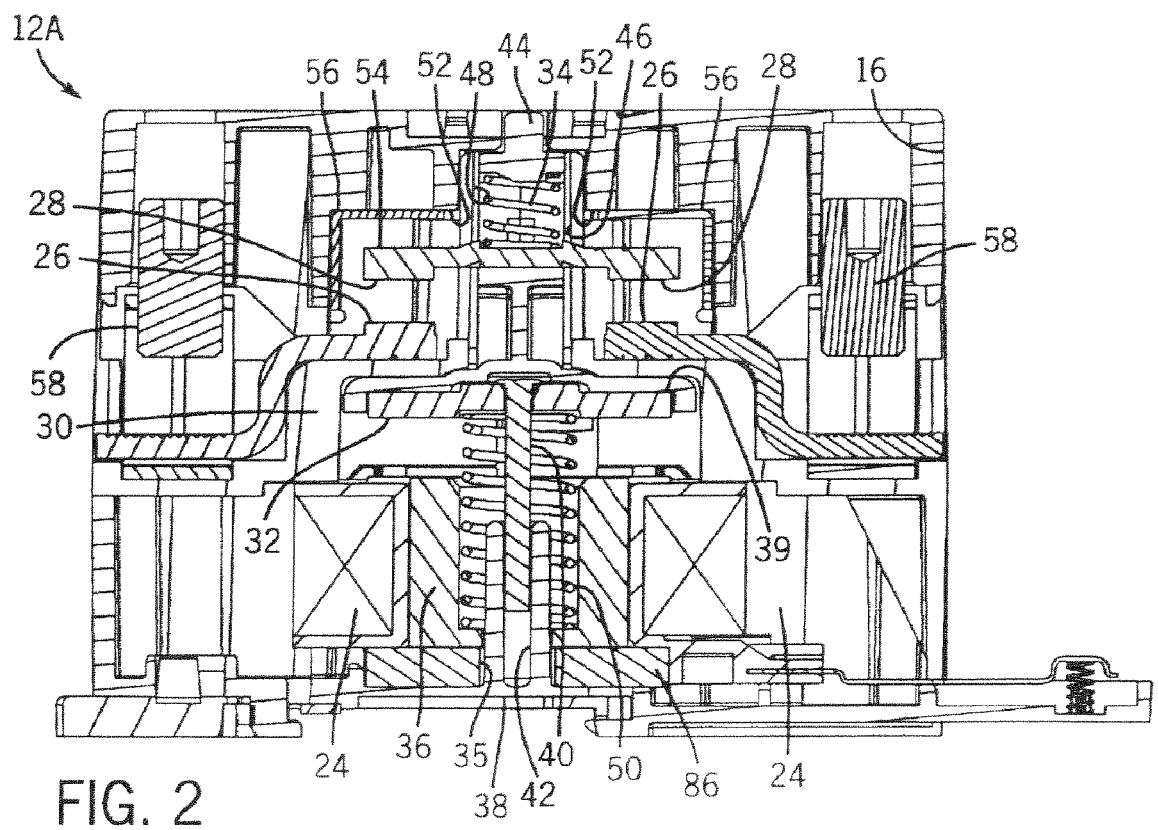
FIG. 2 is a cross-sectional view of one contactor of the modular contactor assembly taken along line 2-2 of FIG. 1.

Referring to FIG. 2, a longitudinal cross-sectional view of one of the contactors 12A-C of the modular contactor assembly 10 taken along line 2-2 of FIG. 1 is shown (without overload relay 13A-C from FIG. 1). Specifically, contactor 12A is cross-sectionally shown but a cross-sectional view of contactors 12B or 12C would be similar. Contactor 12A is shown in a normally open operating position prior to energization of an electromagnetic coil 24 with contacts 26, 28 separated and open. Coil 24 is secured by the contactor housing 30 and is designed to receive an energy source or an in-rush pulse at or above an activation power threshold that draws armature 32 into the magnet assembly 35. A movable contact carrier, secured to the armature 32, is also drawn towards magnet assembly 35. Contacts 28, which are biased by spring 34 towards stationary contacts 26, are now positioned to close upon stationary contacts 26 and provide a current path. After energization of coil 24, a second energy source at or above a reduced holding power threshold of the coil 24 is provided to the coil and maintains the position of the armature 32 to the magnet assembly 35 until removed or a high fault current occurs thereby overcoming the reduced power threshold to disengage the armature from the magnet assembly causing the separation of the contacts, as will be described in greater detail hereinafter.

Magnet assembly 35 consists of a magnet post 36 firmly secured to magnet frame 86. Magnet post 36, magnet frame 86, and armature 32 are typically solid iron members. Coil 24 includes a molded plastic bobbin wound with copper magnet wire and is positioned centrally over magnet post 36 and inside magnet frame 86. Preferably, coil 24 is driven by direct current and is controlled by pulse width modulation to limit current and reduce heat generation in the coil. When energized, magnet assembly 35 attracts armature 32 that is connected to a movable contact carrier 39. Moveable contact carrier 39 along with armature 32 is guided towards magnet assembly 35 with guide pin 40 and molded housing 30 walls 46, 48.

Guide pin 40 is press-fit or attached securely into armature 32 which is attached to movable contact carrier 39. Guide pin 40 is slidable along guide surface 42 within magnet assembly 35. The single guide pin 40 is centrally disposed and is utilized in providing a smooth and even path for the armature 32 and movable contact carrier 39 as it travels to and from the magnet assembly 35. Movable contact carrier 39 is guided at its upper end 44 by the inner walls 46, 48 on the contactor housing 30. Guide pin 40 is partially enclosed by an armature biasing mechanism or a resilient armature return spring 50, which is compressed as the movable contact carrier 39 moves toward the magnet assembly 35. Armature return spring 50 is positioned between the magnet post 36 and the armature 32 to bias the movable contact carrier 39 and armature 32 away from magnet assembly 35. A pair of contact bridge stops 52 limits the movement of the contact bridge 54 towards the arc shields 56 during a high fault current event. The combination of the guide pin 40 and the armature return spring 50 promotes even downward motion of the movable contact carrier 39 and assists in preventing tilting or window-locking that may occur during contact closure. When the moveable contact carrier 39, along with armature 32, is attracted towards the energized magnet assembly 35, the armature 32 exerts a compressive force against resilient armature return spring 50. Together with guide pin 40, the moveable contact carrier 39 and the armature 32, travel along guide surface 42 in order to provide a substantially even travel path for the moveable contact carrier 39. Three pairs of crimping lugs 58 are provided per contactor and used to secure lead wires to the contactor. Alternatively, a common busbar containing stationary contacts (not shown) may be used as a base for end user wire connection either through ring terminals or appropriately sized lug.

Figure 3:
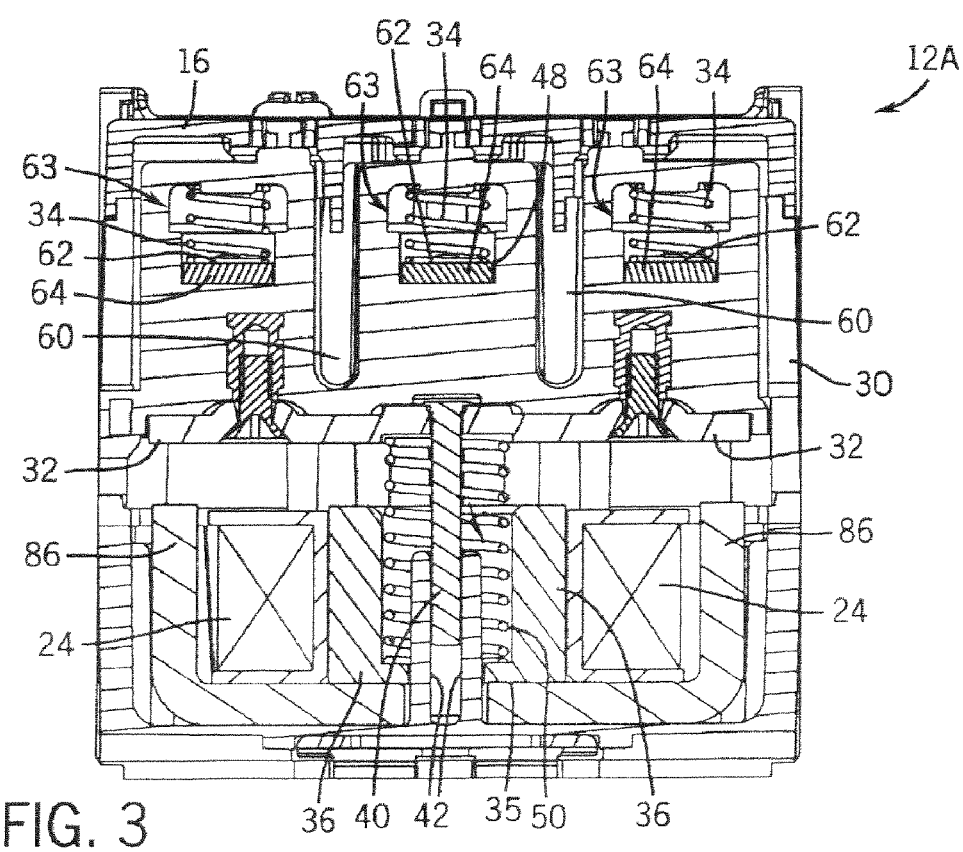
FIG. 3 is a cross-sectional view of one contactor of the modular contactor assembly taken along line 3-3 of FIG. 1

Referring to FIG. 3, a lateral cross-sectional view of the contactor 12A is depicted in the normal open operating position prior to energization of the electromagnetic coil 24. Initially, the armature 32 is biased by the resilient armature return spring 50 away from the magnet assembly 35 toward the housing stops 60 resulting in a separation between the armature and core. The contact carrier assembly also travels away from the magnet assembly 35 due to the armature biasing mechanism 50 which creates a separation between the movable contacts 28 and the stationary contacts 26 preventing the flow of electric current through the contacts 26, 28. Biasing springs 34 are connected to a top surface 62 of movable contact 64 and are extended such that a maximum space 63 results between the top of the spring and the movable contact 64.

Figure 4:
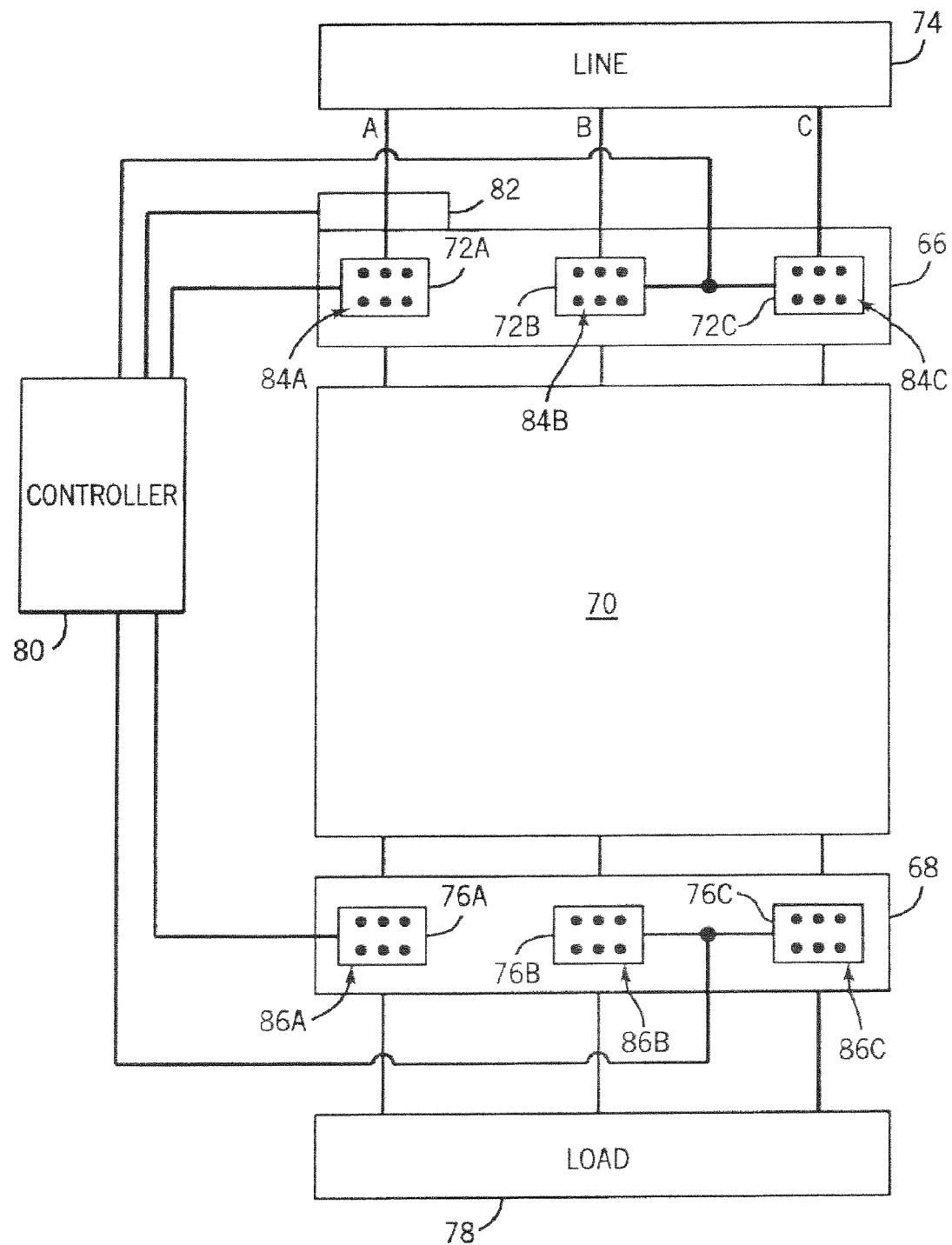
FIG. 4 is a schematic representation of a pair of modular contactor assemblies in accordance with the present invention connected to a soft starter.

Referring now to FIG. 4, a pair of modular contactor assemblies 66 and 68 is shown as isolation devices connected to a softstarter 70. Contactor assembly 66 includes, in a three-phase application, three contactors 72A, 72B, 72C that carry power from a line power source 74 via lines A, B, and C, respectively. Similarly, contactor assembly 68 also includes three contactors 76A, 76B, 76C for a three-phase load 78. As illustrated, there are three contactors within a single contactor assembly before and after the soft starter. Contactor assemblies 66 and 68 are designed to provide galvanic isolation to the soft starter by independently "breaking open" their contactors after the soft starter interrupts the circuit, or in the case of a shorted SCR in the softstarter, interrupts the load themselves (fault condition). Each contactor of contactor assembly 66, 68 includes multiple contacts. Preferably, each contactor includes three contact assemblies and each contact assembly includes one line side contact, one load side contact, and one connecting or bridge contact for connecting the line and load side contacts to one another. For example, the bridge contacts may be moveable contacts such as those previously described.

Controller 80 is connected to an actuating assembly (not shown) in each contactor that is arranged to move the contact assemblies of each contactor in unison between an open and closed position. Each actuating assembly comprises a coil, armature, and magnetic components to effectuate "breaking" and "making" of the contacts, as was described above. Controller 80 is designed to transmit control signals to the actuating assemblies to independently regulate the operation of the contactors. The controller triggers the actuating assemblies based on current data received from a current sensing unit 82, that in the embodiment shown in FIG. 4, is constructed to acquire current data from first phase or pole A of the three-phase line input. While current sensing unit 82 is shown to acquire current data from first phase or pole A, current sensing unit 82 could be associated with the second or third phases or poles B and C of the three-phase line input.

Since each contactor 72A-C and 76A-C has its own actuating assembly, each contactor may be independently opened and closed. This independence allows for one contactor to be opened without opening the remaining contactors of the modular contactor assembly. For example, a first contactor 72A, 76A can be opened and the remaining contactors 72B-C, 76B-C can be controlled to not open until the contacts of the first contactor 72A, 76A have cleared. This delay and subsequent contactor opening reduces arc erosion of the contacts of the subsequently opened contactors since each contactor can be controlled to open when the phase for that contactor is at or near a zero current point. Thus, arcing time is at a minimum. As described above, each contactor 72A-C, 76A-C includes three contact assemblies 84A-C, 86A-C. Each contact assembly is made up of movable contacts and stationary contacts. The contact assemblies within each contactor are constructed to open in unison and are therefore controlled by a common crossbar or bridge. As such, the contact assemblies within a single contactor operate in unison, but the contactors are asynchronously or independently operated with respect to another. As will be described below, controller 80 is connected to contactors 72A and 76A directly but is connected to contactors 76B-C and 76B-C in parallel. As such, contactors 72B-C and 76B-C can be controlled simultaneously.

Figure 5:
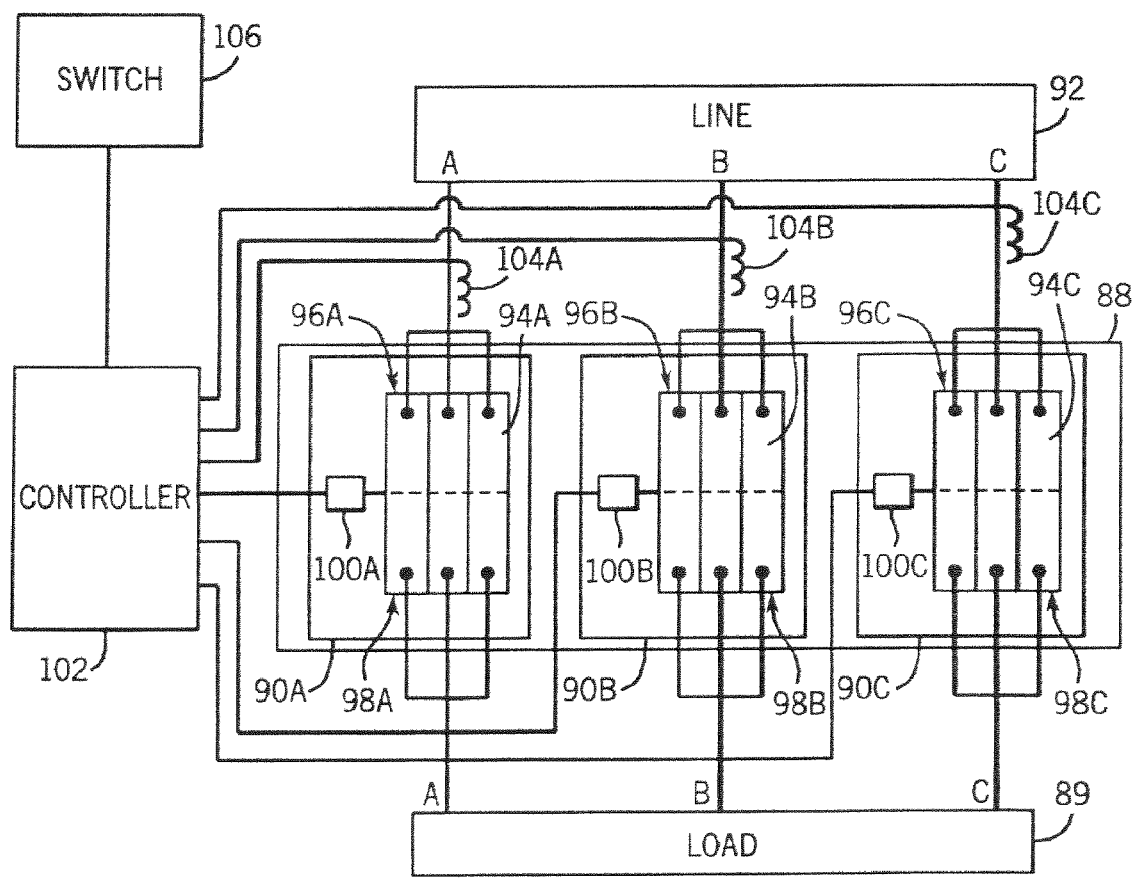
FIG. 5 is a schematic representation of a modular contactor assembly in accordance with another aspect of the present invention.

Referring now to FIG. 5, contactor assembly 88 may be implemented as a switching device to control and protect a load 89 connected thereto. Contactor assembly 88 includes three contactors 90A-C. The number of contactors coincides with the number of phases of the line input 92 as well as load 89. Therefore, in the example of FIG. 5, a contactor is provided for each phase of the three-phase line 92 and load 89. Each contactor 90A-C includes three contact assemblies 94A-C. Each assembly 94A-C includes multiple line side contacts 96A-C and multiple load side contacts 98A-C. Each contactor includes an actuating assembly 100A-C that is connected to and controlled by a controller 102. Controller 102 controls breaking and making of the contacts of each contactor by triggering the actuating assembly in the contactor based on fault data received from transducers 104A-C. Alternately, breaking and making of the contacts could be controlled by an override control or switch 106.

The timing of the breaking of each contactor is determined based on current data received from transducers 104A-C. In a three-phase input environment, three transducers 104A, 104B, and 104C are used. By implementing a transducer for each phase, each contactor may be identified as the "first" pole contactor, as will be described in greater detail below. Conversely, only one transducer may be implemented to collect current data from one phase and the contactor corresponding to that phase would be considered the "first" pole contactor. However, any contactor can be the "first" pole contactor.

Figure 6:
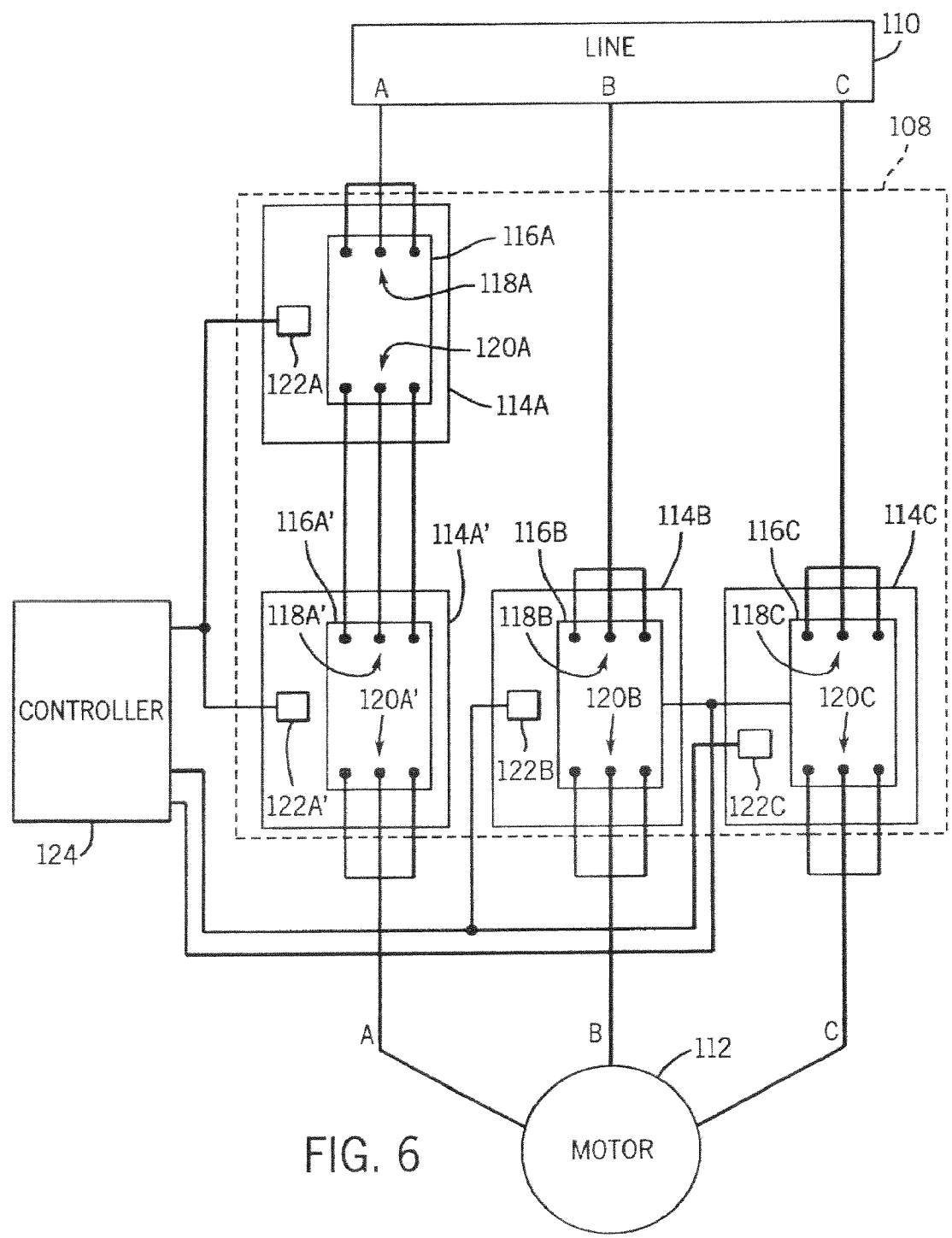
FIG. 6 is a schematic representation of a modular contactor assembly in accordance with the present invention as a motor controller.

Referring now to FIG. 6, a contactor assembly 108 is shown in a typical motor control application configuration between a power line source 110 and a three-phase motor 112. Contactor assembly 108 is a modular contactor assembly and includes four contactors 114A, A', B, C similar to the contactors heretofore described. Each contactor 114A-C includes a set of contact assemblies 116A-C. Specifically, each contact assembly includes a set of line side contacts 118A-C and load side contacts 120A-C. Each contactor also includes an actuating assembly 122A-C that breaks and makes the contact assemblies of each respective contactor in unison. However, since each contactor has its own actuating assembly, the contactors can be independently controlled.

Connected to each actuating assembly and constructed to independently control the contactors is controller 124. Controller 124 opens and closes each contactor based on the corresponding phase A-C of the contactor crossing a particular current value or voltage value. In one embodiment, each contactor is controlled to open when the current in the corresponding phase is approximately zero. Opening of the contacts of the contactor at or near a zero current reduces the likelihood of arc erosion between the contacts of the contactor. However, controller 124 can be configured to independently open the contactors based on the current in the corresponding phase reaching/crossing a particular non-zero value. Current data is acquired by at least one current sensor (not shown) connected between the line 110 and the contactors 114A-C.

Still referring to FIG. 6, contactors 114A and 114A' are shown as being serially connected to another. This configuration has a number of advantages, particularly for high voltage applications (i.e. greater than 600 V). Connecting two contactors in series and designating the two contactors as the first contactors to open when a fault is detected or open command is issued allows the two serially connected contactors 114A,A' to share high switching energy stress. As a result, more energy is dissipated in the contactors 114A,A' thereby reducing the energy absorption burden of contactors 114B,C. Additionally, since contactors 114A,A' are also connected to the controller in parallel with another, the controller can cause contactors 114A,A' to open simultaneously. This results in a greater arc voltage being generated by the four arcs as opposed to a conventional double break system and reduces the current and contact erosion. The multiple contact gaps also reduce the likelihood of re-ignitions after current zero.

The configuration illustrated in FIG. 6 shows an embodiment of the present invention; however, additional configurations not shown are contemplated and within the scope of this invention. For example, in jogging applications, three sets of two serially connected contactors may be arranged in parallel and independently controlled.

As stated above, the modular contactor assembly includes multiple contactors that are independently opened by an actuating mechanism controlled by a controller based on current data acquired from one or more current sensors. Since the contactors have a unique actuating assembly, the contactors can be controlled in accordance with a number of control techniques or algorithms. Some of these control schemes will be described with respect to FIGS. 7-9.

Figure 7:
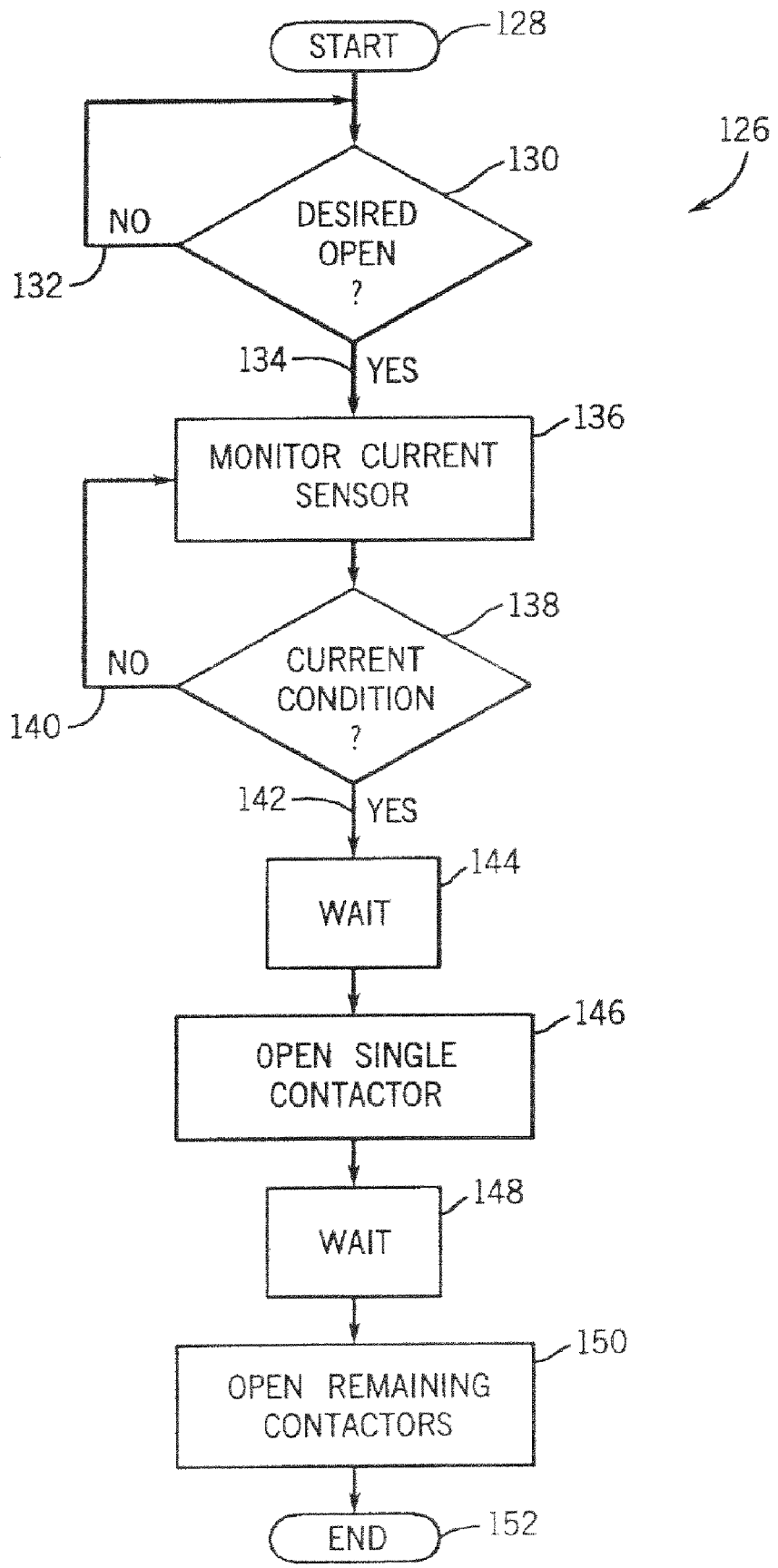
FIG. 7 is a flow chart setting forth the steps of a technique of independently controlling contactors of a modular contactor assembly in accordance with one aspect of the present invention.

Referring now to FIG. 7, the steps of a control technique or algorithm for a modular contactor assembly in accordance with the present invention is shown. The steps carried out in accordance with technique 126 are equivalently applicable with a modular isolation contactor, a modular heating load contactor, a modular on-demand switching contactor, and the like. The steps begin at 128 with identification that an open condition is desired 130. Identification of a desired open condition may be the result of either a dedicated switch open command or a fault indicator signal indicating that a fault condition is present and at least one contactor should be opened. If an open condition is not desired 130, 132, the technique recycles until an open condition is desired 134. When an open condition is desired 130, 134, current in a phase of the input power is monitored at 136 using a current sensor. Current is monitored to determine when a specified current condition 138 occurs. Until the current condition occurs 138, 140, current in the phase is monitored. Once the current condition occurs 138, 142, a wait step 144 is undertaken.

The current condition, in one embodiment, is a current zero in the monitored phase of the three-phase input. Wait step 144 is a time delay and is based on the time required from the actuating assembly receiving the switch open signal to the actual contact separation of the corresponding contactor. After the time delay has expired 144, a switch or break open signal is sent to the actuating assembly for a single contactor at step 146. The multiple contact assemblies for the contactor are then caused to open and, as such, an open circuit is created between the line and load for the corresponding phase of the three-phase input.

After the single contactor is opened at step 146, a wait step 148 is once again undertaken. The waiting period at step 148 is of sufficient length to insure that the single contactor has opened before the remaining contactors of the contactor assembly are opened at 150. Preferably, the contacts of the single contactor are opened one to two milliseconds before current zero. After the remaining contactors are opened at step 150, all of the contactors are opened and an open circuit between the line and load is created 152.

Figure 8:
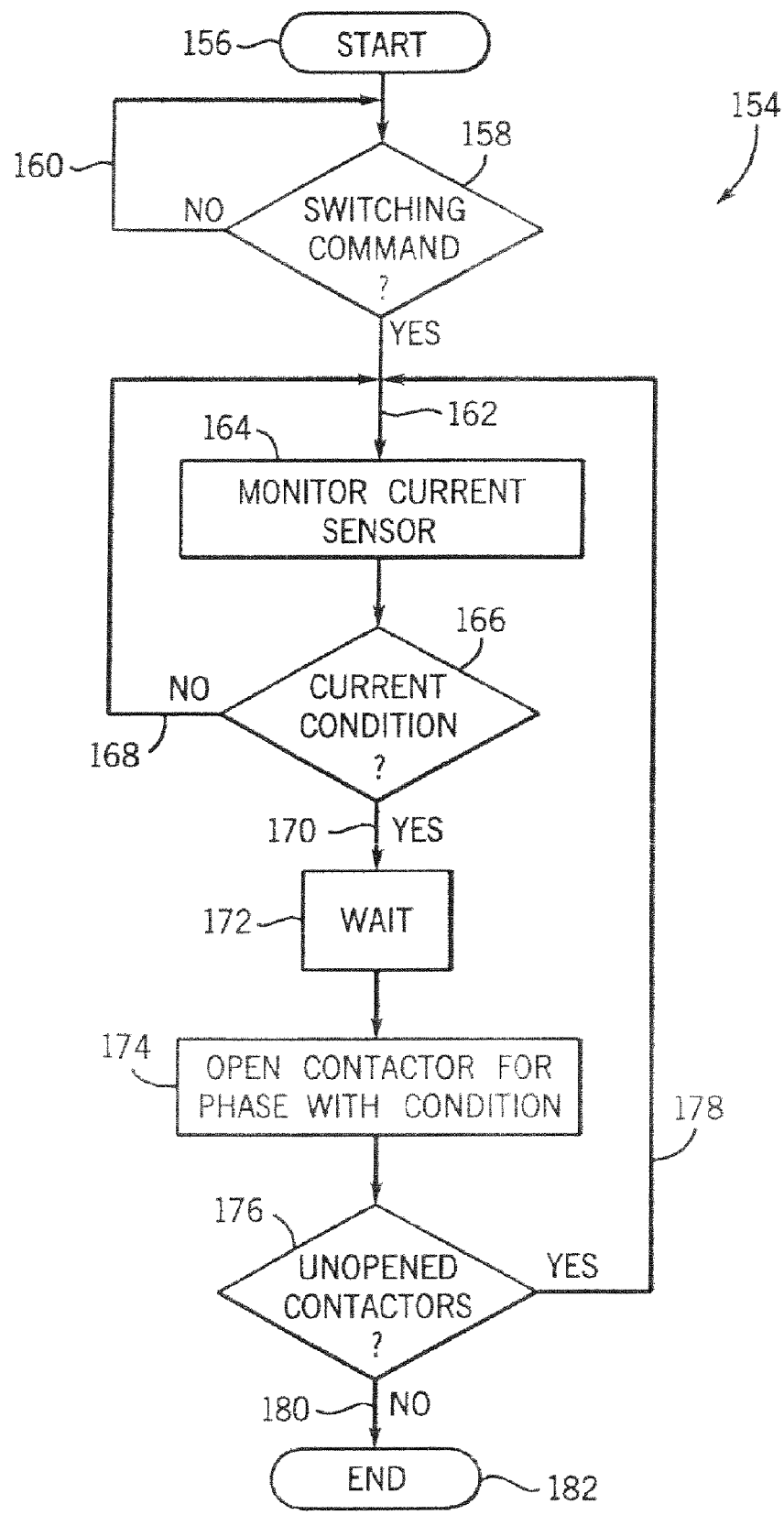
FIG. 8 is a flow chart setting forth the steps of a technique of independently controlling contactors of a modular contactor assembly according to another aspect of the present invention.

Referring now to FIG. 8, another technique 154 for controlling modular contactors in a single contactor assembly begins at step 156, and awaits a desired open switching or fault command at step 158. If an open condition is not desired 158,160, technique 154 recycles until an open condition is desired 158,162. When an open condition is desired, current in each phase of the three-phase input signal is monitored at 164. As such, technique 154 is particularly applicable with a modular contactor assembly dedicated for controlled switching wherein each phase has a dedicated current sensor or transducer, similar to that described with respect to FIG. 5.

Current is monitored in each phase to determine when a current condition in that phase occurs 166. Monitoring continues until current in the phase crosses a specific point or value 166, 168. The current condition is preferably defined as the next current zero in the phase following receipt of the switching or fault indicator signal. However, the current condition could also be any non-zero point on the current wave. Once the current condition is identified in a single phase 166, 170, technique 154 undergoes a wait or hold step at 172. The time period of the wait step 172 is a delay time based on the time required from an actuating assembly receiving an open contactor signal for that contactor to the actual breaking of the contacts in the contactor. Once the delay time has expired, the contactor for the phase in which the current zero condition was identified is opened at step 174. Preferably, the contact assemblies of the contactor are opened in unison one to two milliseconds before the next current zero in the phase corresponding thereto.

Once the contactor is opened 174, a determination is made as to whether there are additional contactors that are unopened 176. If so 176, 178, technique 154 returns to step 162 wherein current is monitored in the phases of the closed contactors. As such, each contactor is independently opened with respect to one another. Because the second and third phase current will have the same phase angle after the first phase is cleared, the contactors in the last two phases will open simultaneously. Once all the contactors are opened 176, 180, the process concludes at step 100 with all of the contactors being in an opened or broken state.

Figure 9:
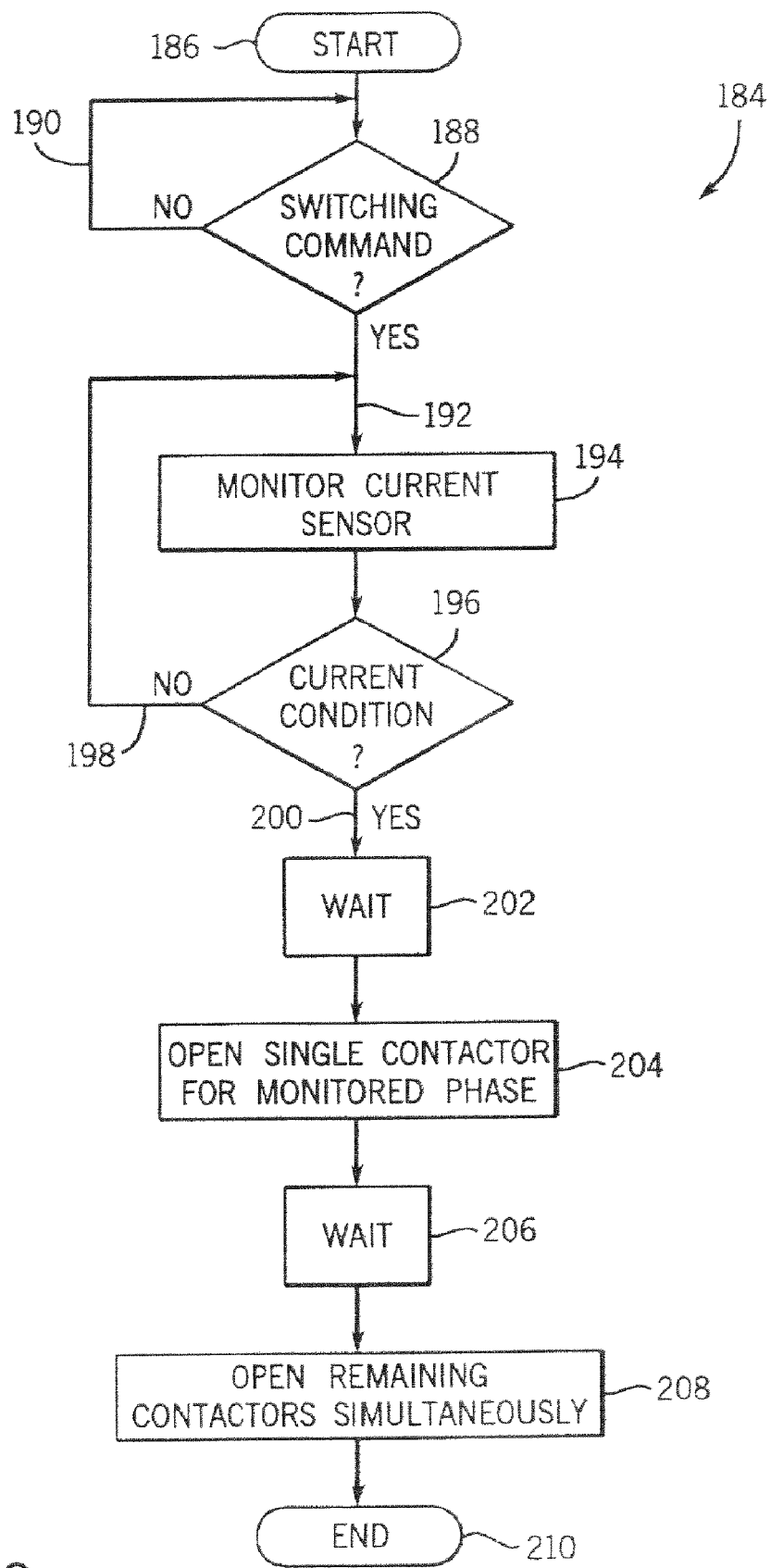
FIG. 9 is a flow chart setting forth the steps of a technique for independently controlling contactors of a modular contactor assembly in accordance with another aspect of the present invention.

Referring now to FIG. 9, a technique or process 184 particularly applicable to independently controlling contactors of a modular isolation contactor assembly begins at 186, and at step 188 a switching or fault command indicative of a desired open condition is identified. If an open condition is not desired 188, 190, the process recycles until such a command is received. Failure to receive such command is indicative of a desire for continued electrical connection between a line and a load. Once a switching or fault indicator signal or command is received 188, 192, current is monitored using a current sensor in one phase of a three-phase input signal. Any phase of a three-phase input may be monitored but, preferably, only one phase is, in fact, monitored. Current in the phase is monitored to determine when a specified current condition occurs 114. Preferably, the current condition is defined as a current zero signal being received from the current sensor based on the monitored phase crossing a current zero point. However, a non-zero point on the current signal could also be considered the specified current condition. If a current condition is not received 196, 198, the process continues monitoring current in the selected phase. Once the current condition occurs and is identified by the controller 196, 200, the process implements a wait step 202 before the controller transmits a break open signal to an actuating assembly for the single contactor corresponding to the monitored phase. The wait or delay period is based on a time interval required from the actuating assembly receiving the signal to the breaking open of the corresponding contactor.

Once the delay time has expired 202, the contactor corresponding to the monitored phase is opened at 204. Preferably, the contactor is broken at a point one to two milliseconds before the next current zero in the corresponding phase. At step 206, the process waits until the multiple contacts have opened before opening the remaining contactor at step 208. Preferably, the remaining contactors are opened simultaneously. For example, in a three-phase environment, a first pole contactor would be opened and subsequent thereto the contactors for the second and third poles, respectively, would be simultaneously opened by their respective actuating assemblies. Once all the contactors are opened, the line and load are isolated from each other and the process ends 210.

The present invention has been described with respect to independently breaking contactors of a modular contactor assembly. However, there are a number of advantages of the present invention with respect to making or closing of independently controlled contactors. Point-on-Wave (POW) switching or control is particularly advantageous with the modular contactor assembly of the present invention. POW switching allows the contacts of a contactor to be closed based on voltage data acquired from a voltage sensor and be opened based on current data acquired from a current sensor. POW switching reduces contact erosion and therefore improves contact switching by breaking open the contacts of the contactor in such a manner as to minimize or prevent an arc being formed between the contacts. For closing of the contacts, POW switching is also beneficial in reducing negative torque oscillations in the motor (load) by closing the contacts at precise voltage points.

Figure 10:
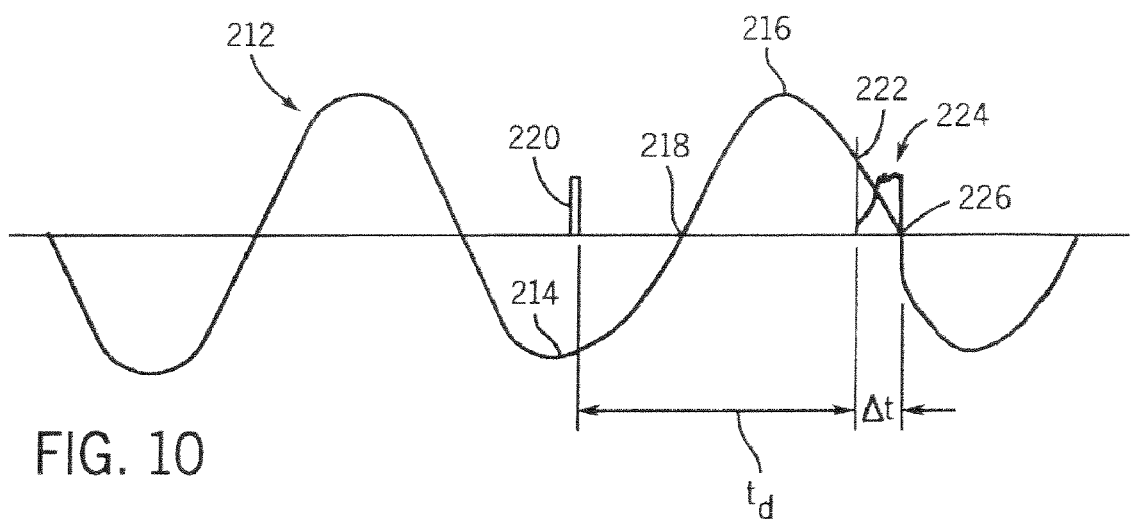
FIG. 10 is a waveform for a single phase of current during opening a contactor in accordance with the present invention.

Referring now to FIG. 10, a typical sinusoidal current waveform 212 for a single phase of a three-phase power signal is shown. The value of the current varies along each point of the waveform from a maximum negative current value 214 to a maximum positive current value 216. Between successive minimum values (or maximum values), the waveform crosses a zero point 218. At point 218, the current for the corresponding phase being applied to the load is at or near a minimum. As discussed above, it is desirable to open a contactor when the current waveform is at or near point 218 to reduce an arc being formed between the contacts of the contactor.

Waveform 212 is generally constant as power is supplied to the load. Variations in magnitude, frequency, and phase will occur over time, but waveform 212 is generally constant. According to one aspect of the present invention, when an open condition is desired, a switching command or fault indicator signal 220 is received. In FIG. 10, the switching signal is shown relative to the current waveform and corresponds to when the waveform is at point 214. However, this is for illustrative purposes only and the switching or open signal can be received at any point in the current continuum. If the contacts were opened the moment the open condition was desired (switching signal received), the magnitude of the current at that point would be at or near a maximum. This would increase the break arcing time and subsequent contact erosion. Therefore, the controller delays the opening of the contactor by an interval $t_d$. At point 222 the contacts of the contactor are opened. An open circuit condition between the line and the load for that phase does not immediately occur. There is a period $\Delta t$ between the separation of the contacts and an open circuit condition. At $\Delta t$, the short duration of break arc occurs and helps to minimize contact erosion and to prevent re-ignition after current zero, as was discussed above. At point 226 on the waveform, the contactor is opened and an open condition between the line and load is achieved.

Figure 11:
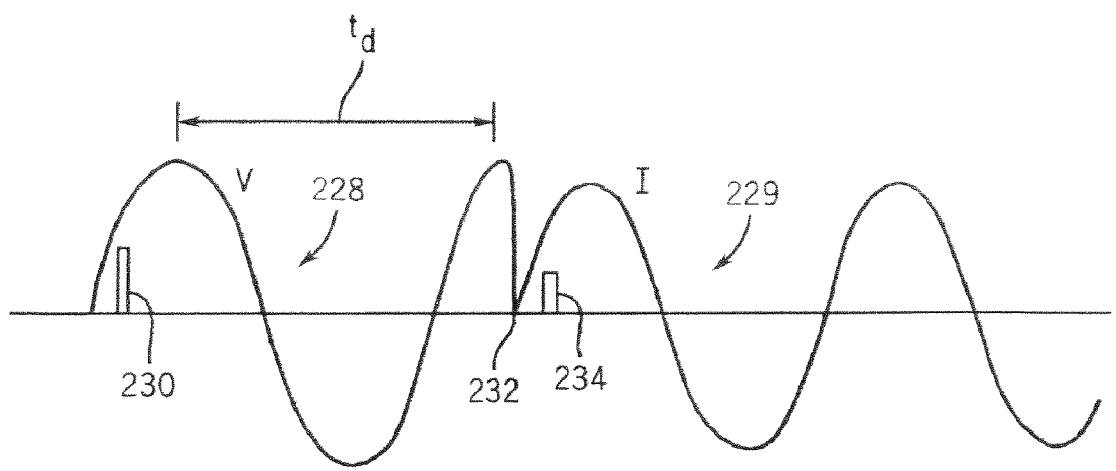
FIG. 11 is a waveform for a single phase of current during closing of a contactor in accordance with the present invention.

Point-on-wave switching is an advantage of the present invention. The purpose of point-on-wave closing is to minimize the asymmetric component in the make currents so to reduce negative torque oscillations in a motor (load) as well as to minimize the bounce arc erosion and contact welding. Referring now to FIG. 11, a set of voltage and current waveforms 228, 229, respectively, for a single phase of a three phase power signal is shown to illustrate "making" or closing of a contactor in accordance with the present invention. The designated $1^{st}$ pole to close does not need to "make" at any specific phase angle of the system voltage since there will be no current flow through the contactor. The $2^{nd}$ and $3^{rd}$ poles, however, close at a specific point on the voltage wave form to reduce high transient current and the resultant negative torque oscillations. Making of the contacts in each of the $2^{nd}$ and $3^{rd}$ contactors is based on at least one voltage data value from a voltage sensor, and in the illustrated example, a close contactor signal is received at point 230 on the waveform. A delay period $t_d$ is observed whereupon only after the designated first pole contactor is closed. After the time delay has lapsed, the contacts of a second contactor are closed at point 232 which is preferably within a 65 to 90 degree phase angle of the system voltage depending on the power factor of the load. Arcing due to contact bounce can also be minimized or eliminated by using multiple sets of contacts in each contactor. Reducing bounce arc 234 is advantageous as it also leads to contact erosion and contact welding. Controlling when the contacts are closed also reduces negative torque oscillations in the motor.

Figure 12:
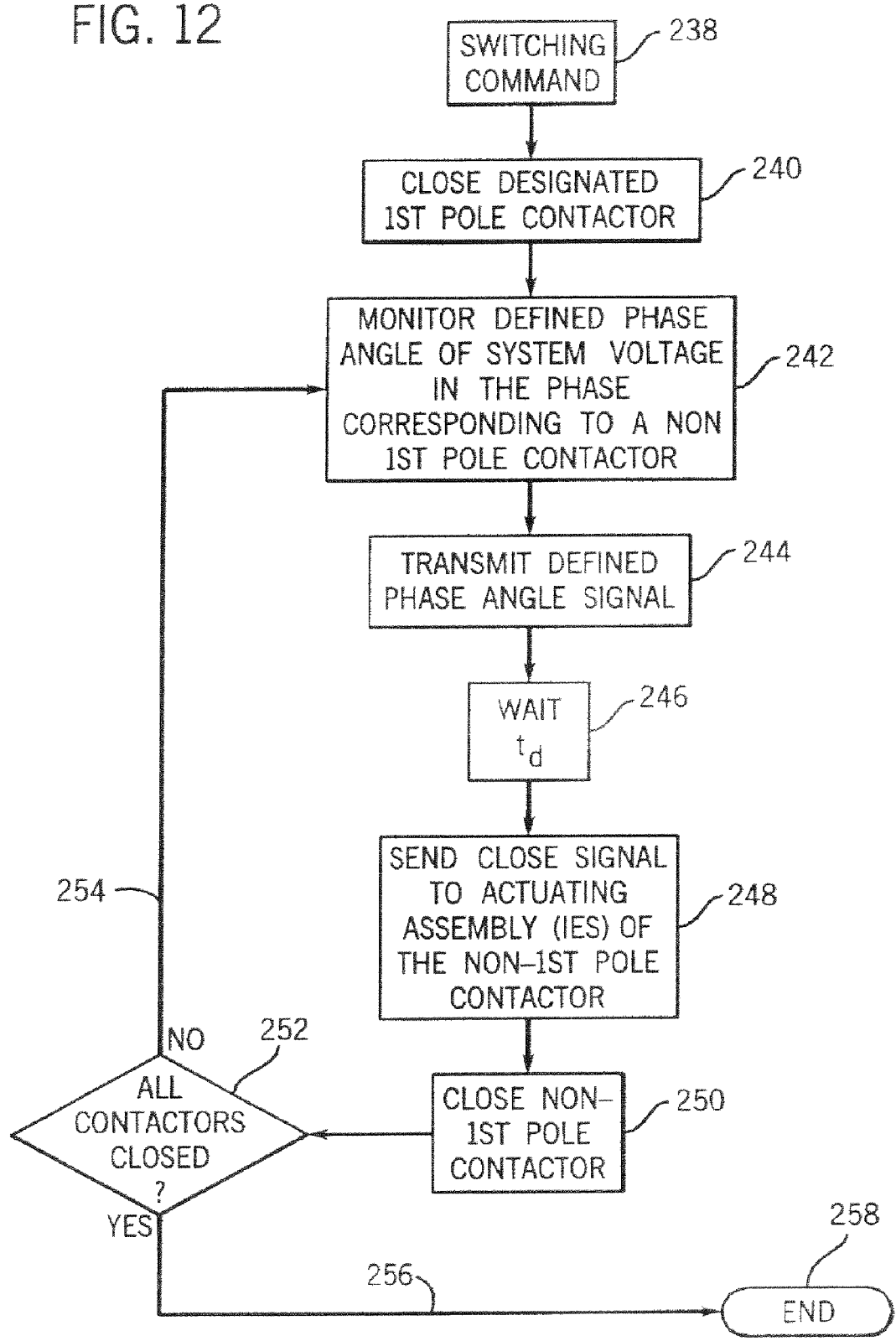
FIG. 12 is a flow chart setting forth the steps of a technique for independently controlling the closing of contactors of a modular contactor assembly in accordance with a further embodiment of the invention.

The steps of a technique or process of "making" or closing contactors independently of a modular or multi-contactor assembly are set forth in FIG. 12. The technique 236 begins at 238 with a switching command being sent from the controller to the actuating assembly or assemblies for the designated first pole contactor 238. As stated above, the designated first pole contactor may be closed independent of the specific phase angle of the system voltage because there is no current flowing through the contactor prior to its closing. Based upon the switching command, the actuating assembly for the designated first pole contactor causes the contacts within the contactor to close at 240. It should be noted that the present technique 236 may be implemented with a contactor having a single actuating assembly or more than one actuating assembly. Additionally, while it is preferred that each contactor includes multiple sets of contacts, the present technique 236 may be implemented with a contactor having a single set of contacts.

After the designated first pole contactor has closed 240, a defined phase angle of the system voltage in the phase corresponding to a non-first pole contactor is monitored at 242. By monitoring the phase in a non-first pole contactor, the non-first pole contactor may be closed at a specified point on the waveform. A signal indicative of the defined phase angle in the system voltage corresponding to the non-first pole contactor is transmitted to the controller at 244. The defined phase angle signal may be transmitted from a voltage sensor or other detection or sensory device. Upon receipt of the defined phase angle signal, the controller waits until expiration of a delay time at 246. The delay time, as discussed previously, is based on the amount of time required from the actuating assemblies of a contactor receiving a switching signal to the closing of the contacts in a contactor. Upon expiration of the time delay, the controller sends a close contact signal to the actuating assemblies of the non-first pole contactor 248 thereby causing the contacts of the non-first pole contactor to close at 250. As stated above, the non-first pole contactor is preferably closed between approximately 65 degrees to approximately 90 degrees of the phase angle of the system voltage depending upon the power factor of the load.

After the non-first pole contactor is closed at 250, a determination is made as to whether additional contactors remain open at 252. If all the contactors have not been closed 252, 254, the technique or process returns to step 242 and carries out the steps or functions previously described. However, if all the contactors of the contactor assembly have closed 252, 256, technique 236 ends at 258 with current flowing through each of the contactors. Preferably, at the conclusion of technique 236, the controller implements one of the techniques or processes previously described with respect to FIGS. 7, 8, or 9 to independently control the opening of the contactors of the contactor assembly when an open condition is desired.

Figure 13:
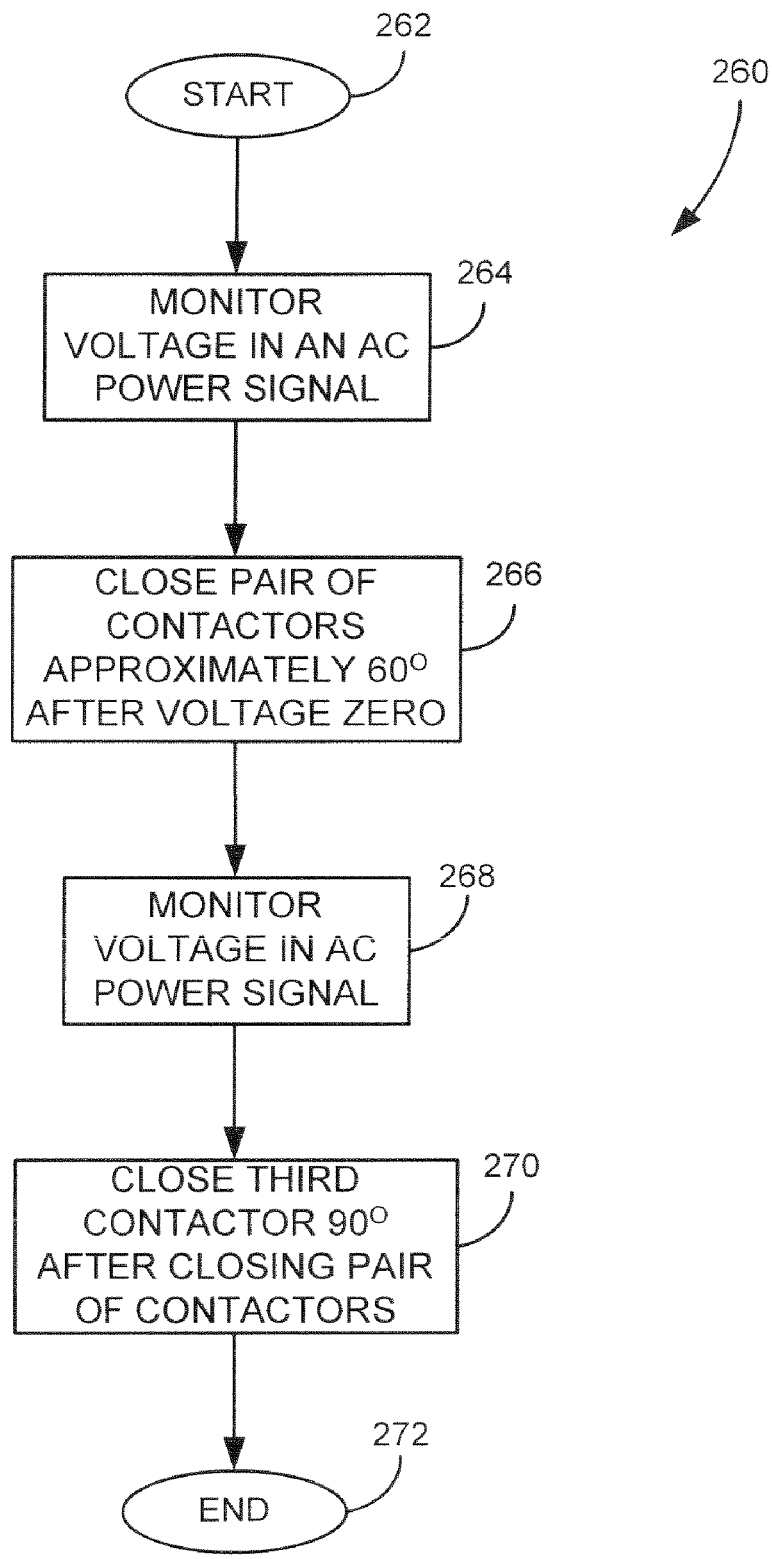
FIG. 13 is a flow chart setting forth the steps of another technique for independently controlling the closing of contactors of a modular contactor assembly in accordance with a further embodiment of the invention.

Referring now to FIG. 13, the steps of an alternate technique or process of independent controlling the closing of contactors of a modular contactor assembly in such a way as to minimize high transient current and the resultant negative torque oscillations is set forth. Technique 260 is applicable with a three-phase power source and may be used with a contactor assembly having three independent single pole contactors or, alternately, a two-pole contactor and a single-pole contactor preferably housed within a single contactor assembly housing. Technique 260 begins at 262, and at 264, voltage in an AC power signal is monitored. The AC power signal may be output from a utility line source or other type of power source, such as engine driven power sources. By monitoring voltage in the power source, precise point-on-wave closing of contactors may be achieved. That is, voltage of the power signal is monitored to determine a zero-crossing point. A pair of contactors is then caused to be closed by a common, or separate, actuating assembly, at a specified phase, preferably, approximately sixty degrees after the zero-crossing point 266. After the pair of contactors is closed, voltage in the power signal is again monitored at 268 such that a third contactor may be caused to close at a prescribed moment 270. Preferably, the prescribed moment is approximately ninety degrees after the closing of the pair of contactors. Delaying the closing of the third contactor until after the closing of the third contactor reduces negative torque oscillations in the system thereby reducing stress on the system.

The present invention has been described with respect to designated first pole switching wherein the contactor for one pole or phase of a three-phase input or load is broken or opened before the remaining contactors are opened. An advantage of this construction is that any contactor may be designated the "first" pole contactor. Further, this designation can be selectively changed such that the "first" pole designation is rotated among all the contactors. Rotating the "first" pole designation between the contactor evens out contact erosion between the contactors thereby achieving constant and consistent operation of the contactors. The rotation designation can be automatically done by programming the controller to change designation after a specified number of makes and break events or manually by changing the order the lead wires are connected to the contactor assembly.

Accordingly, in one embodiment, the present invention includes a method of controlling contactor switching that includes the step of monitoring voltage in an electrical system having a power source and a load. At least a first contactor of a multi-contactor assembly is closed at a first phase angle following a voltage zero-crossing in the system. Thereafter, another contactor is closed at a prescribed moment following the closing of the first contactor.

In accordance with another embodiment of the present invention, a modular contactor system includes a plurality of stationary contacts and a plurality of movable contacts housed within a single contactor assembly. A plurality of actuating assemblies is provided and each of which is in operable association with at least one movable contact. A controller is in operable association with the plurality of actuating assemblies and is configured to cause less than all the plurality of movable contacts to engage less than all the stationary contacts.

According to another embodiment of the invention, a controller is provided to independently regulate closing of contactors of a modular contactor assembly. The controller is programmed to transmit a first contactor close signal to at least one actuating assembly for a pair of contactors at a first moment after a preceding voltage zero-crossing in an electrical system so as to close the pair of contactors. The controller is further programmed to transmit a second contactor close signal to an actuating assembly for a third contactor at a second moment after the first moment so as to close the third contactor such that high transient current and the resultant negative torque oscillations in the electrical system are minimized.

The present invention has been described in terms of the preferred embodiment, and it is recognized that equivalents, alternatives, and modifications, aside from those expressly stated, are possible and within the scope of the appending claims.

What is claimed is:

1. A method of controlling contactor switching comprising the steps of:
   monitoring voltage in an electrical system having a power source and a load;
   closing at least a first contactor of a multi-contactor assembly at a first phase angle following a voltage zero-crossing in the system, the multi-contactor assembly configured to regulate power supplied to the load by the power source; and thereafter
   closing another contactor of the multi-contactor assembly at a prescribed moment following the closing of the first contactor.

2. The method of claim 1 wherein the prescribed moment includes a second phase angle of the voltage in the system.

3. The method of claim 2 wherein the specified phase angle depends upon a power factor of the load.

4. The method of claim 3 wherein the first phase angle is approximately 60° and the second phase angle is approximately 90°.

5. The method of claim 1 further comprising the step of delaying the closing of the another contactor until expiration of a wait period.

6. The method of claim 5 wherein the wait period is defined by a time between transmission of a switching command and closing of a contactor.

7. The method of claim 1 wherein the at least a first contactor includes a first contactor and a second contactor, and further comprising the step of closing the first and the second contactors simultaneously.

8. The method of claim 7 wherein the multi-contactor assembly includes at least one contactor for each phase of a poly-phase load.

9. The method of claim 8 wherein the poly-phase load includes three phases.

10. A modular contactor system comprising:
    a plurality of stationary contacts and a plurality of movable contacts housed within a single contactor assembly;
    a plurality of actuating assemblies, each in operable association with at least one movable contact; and
    a controller in operable association with the plurality of actuating assemblies and configured to cause less than all the plurality of movable contacts to engage less than all the plurality of stationary contacts when the controller receives a closed circuit command signal.

11. The modular contactor system of claim 10 wherein the plurality of stationary contacts and the plurality of movable contacts are arranged into sets of contact assemblies such that the contactor assembly includes a set of contact assemblies for each phase of a poly-phase power source.

12. The modular contactor system of claim 11 wherein the less than all the movable contacts and the less than all stationary contacts correspond to a single set of contact assemblies.

13. The modular contactor system of claim 12 wherein the controller is further configured to engage the plurality of stationary contacts and the plurality of movable contacts in another set of contact assemblies only after the less than all the movable contacts and the less than all the stationary contacts have engaged one another.

14. The modular contactor system of claim 13 wherein the controller is further configured to close the another set of contact assemblies at a moment that is defined by a specified phase angle of system voltage.

15. The modular contactor system of claim 14 wherein the specified phase angle is between approximately 65° and approximately 90°.

16. A controller to independently regulate closing of contactors of a modular contactor assembly independently, the controller programmed to:
    transmit a first contactor close signal to at least one actuating assembly for a pair of contactors at a first moment after a preceding zero voltage in an electrical system so as to close the pair of contactors; and
    transmit a second contactor close signal to an actuating assembly for a third contactor at a second moment after the first moment so as to close the third contactor such that at least one of high transient current and resultant negative torque oscillations in the electrical system are minimized.

17. The controller of claim 16 wherein the pair of contactors and the third contactor are arranged in a single contactor assembly housing.

18. The controller of claim 17 wherein the single contactor housing includes a contactor for each phase of a poly-phase load.

19. The controller of claim 16 further programmed to delay transmission of the close contactor signal to the pair of contactors until expiration of a delay period.

20. The controller of claim 16 further programmed to transmit the first close contactor signal to the pair of contactors such that the pair of contactors is closed approximately 60° after the zero voltage.

21. The controller of claim 16 further programmed to transmit the second close contactor signal to the actuating assembly for the third contactor such that the third contactor is closed approximately 90° after the zero voltage.

* * * * *